(12) United States Patent
Hente (10) Patent No.: US 9,086,753 B2
(45) Date of Patent: Jul. 21, 2015

(54) OLED DEVICE AND AN ELECTRONIC CIRCUIT

(75) Inventor: Dirk Hente, Wuerselen (DE)

(73) Assignee: Koninklijke Philips N.V., Eindhoven (NL)

( * ) Notice: Subject to any disclaimer, the term of this patent is extended or adjusted under 35 U.S.C. 154(b) by 658 days.

(21) Appl. No.: 13/121,207

(22) PCT Filed: Sep. 25, 2009

(86) PCT No.: PCT/IB2009/054200
§ 371 (c)(1),
(2), (4) Date: Mar. 28, 2011

(87) PCT Pub. No.: WO2010/038179
PCT Pub. Date: Apr. 8, 2010

(65) Prior Publication Data
US 2011/0187668 A1    Aug. 4, 2011

(30) Foreign Application Priority Data
Oct. 1, 2008  (EP) .................................... 08105471

(51) Int. Cl.
| G06F 3/041 | (2006.01) |
| G06F 3/044 | (2006.01) |
| G09G 3/32 | (2006.01) |
| H01L 27/32 | (2006.01) |

(52) U.S. Cl.
CPC .............. *G06F 3/0412* (2013.01); *G06F 3/044* (2013.01); *G09G 3/32* (2013.01); *H01L 27/323* (2013.01)

(58) Field of Classification Search
CPC ......... G06F 3/0412; G06F 3/044; G09G 3/32; H01L 27/323

USPC ................. 345/76–84, 90, 92, 173–184, 204; 315/169.1, 169.3, 169.4; 178/18.01–18.05, 19.01–19.04, 20.01
See application file for complete search history.

(56) References Cited

U.S. PATENT DOCUMENTS

| 3,482,241 | A | 12/1969 | Johnson | |
| 2003/0159910 | A1 | 8/2003 | Caldwell | |
| 2004/0183787 | A1* | 9/2004 | Geaghan et al. ............... | 345/173 |
| 2005/0207204 | A1* | 9/2005 | Tam et al. ..................... | 365/145 |
| 2006/0132477 | A1* | 6/2006 | Kerr et al. ..................... | 345/206 |
| 2006/0197563 | A1* | 9/2006 | Sanchez et al. ............... | 327/156 |
| 2007/0008253 | A1* | 1/2007 | Nathan et al. ................. | 345/76 |
| 2007/0165004 | A1 | 7/2007 | Seelhammer et al. | |
| 2007/0228257 | A1* | 10/2007 | Soltesz et al. ............. | 250/214 A |
| 2007/0291011 | A1 | 12/2007 | Chang | |
| 2008/0007533 | A1 | 1/2008 | Hotelling | |

(Continued)

FOREIGN PATENT DOCUMENTS

| EP | 1589407 A1 | 10/2005 |
| EP | 1635467 A2 | 3/2006 |
| JP | 2008033616 A | 2/2008 |

(Continued)

*Primary Examiner* — Kumar Patel
*Assistant Examiner* — Insa Sadio
(74) *Attorney, Agent, or Firm* — Meenakshy Chakravorty (57) ABSTRACT

An OLED device comprised of: an OLED means for generating light, two or more conductive elements adapted for conducting current, a first substrate for mounting the OLED means and the two or more conductive elements, wherein the substrate has a first surface and a second surface, wherein the OLED means is in contact with the first surface and the two or more conductive elements are mounted to the second surface.

20 Claims, 6 Drawing Sheets (56) References Cited

U.S. PATENT DOCUMENTS

2008/0122758 A1* 5/2008 Kim et al. .................. 345/76
2008/0196664 A1* 8/2008 David et al. ................ 118/623
2008/0211402 A1* 9/2008 DeCook et al. ............. 313/511

FOREIGN PATENT DOCUMENTS

| TW | 578091 B | 3/2004 |
| TW | 200802057 A | 1/2008 |
| WO | 2004010369 A2 | 1/2004 |

* cited by examiner

OLED DEVICE AND AN ELECTRONIC CIRCUIT

FIELD OF THE INVENTION

This invention relates to organic light emitting diodes, and in particular to the integration of organic light emitting diodes and near field imaging touch sensors.

BACKGROUND OF THE INVENTION

Organic Light Emitting diodes (OLED) devices are comprised of two electrodes and an organic light emitting layer. The organic layer is disposed between the two electrodes. One electrode is the anode and the other electrode is the cathode. The organic layer is structured such that when the anode has a voltage bias that is sufficiently positive relative to the cathode, holes are injected from the anode and electrons are injected from the cathode. The necessary voltage bias depends upon the materials used for the organic layers. The holes and electrons recombine within the organic layer to induce an exited state in a molecule comprising the organic layer. Light is emitted during the process of excited molecules relaxing to their ground state. The anode is typically manufactured from a high work function material such as a Transparent Conducting Oxide (TCO), and the cathode is typically manufactured from a highly reflecting material such as aluminum or silver. However, there exist many different electrode designs which allow light to exit the cathode, the anode, or through both the cathode and the anode. The organic layer can be comprised of a single organic film, or it can be comprised of a stack of multiple organic films. OLED devices are useful as indicators and displays can be constructed from patterned arrays of OLED devices.

In conventional capacitive touch sensors, a touch is detected by detecting the change in capacitance between an electrode and ground. The change in the capacitance necessary to trigger a touch response needs to be determined in advance. However, environmental conditions (e.g. the humidity) can affect the capacitance of the electrode to ground and make it difficult to determine the proper change in capacitance that will work for all conditions.

A more sophisticated type of capacitive touch sensor is the Near Field Imaging (NFI) or gradient touch sensor. NFI sensors are typically constructed from a minimum of three layers. There is a bottom dielectric substrate, there is a layer of conductive elements mounted on the dielectric substrate, and there is another dielectric layer mounted on the conductive elements which serve to protect the conductive elements. Each of the conductive elements is adapted to conduct current, and are supplied with a Radio-Frequency (RF) voltage. The current flowing through each element is detected. As an object approaches the NFI sensor the capacitance of the individual conductive elements changes and causes a change in the measured currents.

The change in capacitance can be due to an increase or decrease in the capacitance of the individual conductive elements to ground or they can be due to changes in the electric field caused by the approaching object. Both conductive objects and dielectric objects will cause a change in the capacitance between individual elements. Some elements have their capacitance and hence the measured current change more than others. These localized changes in the current allow the location of the touch to be inferred. The elements which are affected less by the approaching object can be used as a reference compare against when determining the threshold for when a touch has occurred.

PCT Patent WO 2004/010369 discloses a combined Liquid Crystal Display (LCD) screen and NFI touch screen.

SUMMARY OF THE INVENTION

The invention provides for an electronic circuit, an OLED device, an OLED apparatus and an OLED kit. Embodiments of the invention are given in the dependent claims.

Embodiments of the invention provide touch sensors that are very robust and their driving is independent of the environmental conditions such that no adjustment is required. This is accomplished by the lamination of a Near Field Imaging (NFI) sensor foil onto an OLED device. A NFI sensor allows the detection of gradient field changes and is inherently more robust than standard capacitive sensors. Embodiments of the invention are useful for implementing backlight switches and sliders.

Embodiments of the invention provide for an electronic circuit that is adapted for interfacing with an OLED device. The OLED device is comprised of an OLED means which generates light, two or more conductive elements adapted for conducting current, and a substrate for mounting the OLED means in the two or more conductive elements.

Embodiments of the circuit are comprised of a voltage bias means which is able to provide a voltage bias to the OLED means. The voltage bias is a benefit, because the OLED means needs a voltage bias in order to produce light. Electronic circuits are also comprised of an RF voltage means which provides the one or more conductive elements with an RF voltage. The voltage means are an advantage because they provide a constant voltage RF source used in conjunction with the conductive elements of the OLED device to form an NFI touch sensor.

The electronic circuit also has a current measuring means, which is a benefit because it is able to measure the current flow through each of the one or more conductive elements. By supplying the one or more conductive elements with a constant voltage, the current measuring means are able to detect when the current flow through an individual conductive element is able to be detected. The current or the change in the current can be used to detect an object touching the OLED device. Having multiple conductive elements is a benefit, because the current through many different elements can be used to determine if the touch sensor has been touched.

With single element capacitive sensors, the device needs to be adjusted in advance to determine the threshold change in capacitance for which a touch is detected. However, environmental conditions can cause the capacitance that is measured and therefore the current to vary. Embodiment of the invention use the current from several different strips to determine if a touch has been registered by normalizing the result.

The electronic circuit is also comprised of a means for generating a signal which depends upon the current which is flowing through the one or more conductive elements. This could be integrated into an electronic circuit or it could be sent as a control signal to another electronic circuit. This has the advantage that a complex analysis of the change in the currents can be used to generate a signal. For example, the currents can be normalized to the average capacitance. This eliminates any environmental changes. A microcontroller or computer can be used to implement this.

In another embodiment, the electronic circuit is further comprised of a decoupling amplifier which is able to eliminate the effects of the capacitive coupling between the OLED means and the one or more conductive elements. This is an advantage, because the capacitance between the one or more conductive elements and one or more electrodes of the OLED can be larger than the capacitance change induced by a touch. This means that there could be a substantial leakage current flowing from the connective elements to the OLED means. The decoupling amplifier is used to add the same RF bias that is applied to the one or more conductive elements to the OLED means. Since both the OLED means and the conductive elements are changing by the same voltage the capacitance is effectively eliminated between the two. This allows the relative change in the current as measured by the current measuring means to be much larger when an operator's finger or other conductive element is brought near to the touch sensor.

In another embodiment the decoupling amplifier is a unity gain amplifier. Using a unity gain amplifier is a benefit, because this adds exactly the same voltage as was applied to the conductive elements. In this embodiment the electrical connection means are attached to the cathode of an OLED means and the output of that unity gain amplifier is connected to the anode of the OLED means. This is an advantage, because a large number of OLED devices are designed so that the light is transmitted through the anode and through a clear substrate. The OLED means is mounted on one side of the substrate and the NFI touch sensor is mounted on the other side. The anode is then the closest electrode of the OLED means to the NFI sensor.

In another embodiment the capacitance coefficients are calculated using the current flow and the voltage. This has the advantage that a subset of the capacitance coefficients can be determined and can be compared to other capacitance coefficients or subsets of capacitance coefficients. This allows the detection of the small changes of the capacitance between different conductive elements. A dielectric object approaching the touch sensor will alter the electric fields and cause a change in the capacitance between different conductive elements. This change can therefore be used to detect the approach of dielectric objects. A microcontroller or computer can be used to implement this.

In another aspect, embodiments of the invention provide for an OLED device which is comprised of an OLED means for generating light, two or more conductive elements adapted for conducting current, and a first substrate for mounting the OLED means and the two or more conductive elements. The OLED means are mounted on one side of the substrate, and the two more conductive elements are mounted on the other side of the substrate. This has the advantage that the OLED means is capable of being integrated with an NFI touch sensor. The conductive elements are typically protected with a dielectric layer. The conductive elements can be mounted to the first substrate in a variety of ways: they can be deposited or formed directly on the substrate, they can be laminated to the substrate, or they can be glued to the substrate. The conductive elements can also be mounted to or incorporated into the structure of a second substrate. This second substrate can then be mounted or attached to the first substrate.

In another embodiment, the OLED device is further comprised of a second substrate adapted for lamination to the OLED means. The second substrate is fabricated from a transparent material, and is laminated to the first substrate. The two or more conductive elements are mounted to the second substrate. This has the advantage that the OLED means and the conductive elements that are used for the touch sensor can be fabricated separately. The two components can be laminated together.

In another embodiment, the OLED device is further comprised of an NFI touch sensor foil. The NFI touch sensor foil is comprised of the second substrate and the two or more conductive elements. This has the advantage that an NFI touch sensor foil can be laminated to an existing OLED device.

In another embodiment, the second substrate is constructed from a flexible material. This had the advantage that a touch sensor constructed out of a flexible material such as plastic can be mounted to the OLED means.

In another embodiment, embodiments of the invention provide for an OLED device where the thickness of the second substrate is chosen so that the capacitance between the OLED means and the two or more conductive elements is minimized. This is an advantage, because the change in capacitance when a finger is brought near to the NFI sensor is small in comparison to the capacitance between the two or more conductive elements and the OLED means. Increasing the thickness of the substrate reduces the capacitance and therefore makes it easier to detect the change in capacitance when someone touches the NFI screen.

In another embodiment the invention provides for an OLED device where the thickness of the first substrate is chosen so that the capacitance between the OLED means and the two or more conductive elements is minimized. This is an advantage, because the change in capacitance when a finger is brought near to the NFI sensor is small in comparison to the capacitance between the two or more conductive elements and the OLED means. Increasing the thickness of the substrate reduces the capacitance and therefore makes it easier to detect the change in capacitance when someone touches the NFI screen.

In another embodiment the two or more conductive elements are adapted for transmitting light. This is an advantage because the two or more conductive elements are positioned on the substrate where the light comes through the OLED means. If they are not adapted for transmitting light, it will reduce the amount of visible light which an operator or user is able to see. By making them transparent the device is more efficient. Conductive oxides such as ITO can be used to implement this. The conductive elements can also be adapted to transmit light by positioning the conductive elements so that they do not obstruct the light coming from the OLED means. Another alternative is to pattern the conductive elements such that the eye does not detect a regular pattern. This has the advantage of being less distracting to a user and making it less noticeable that there are conductive elements.

In another aspect the invention provides for an OLED apparatus comprised of the OLED device and an electronic circuit for powering and operating the OLED device. The electronic circuit is operable to calculate two or more capacitive coefficients of the capacitance formed by the two or more conductive elements for detecting a user input action. An advantage is that the calculation of these capacitances can be used to implement an NFI sensor, the advantages of which have already been discussed. Examples of user input actions are a user touching the surface to activate a switch, a user sliding his or her finger along the surface of the OLED device, or moving a finger in a circular motion on the surface of the OLED device. NFI sensors are able to detect the proximity of both conductive and dielectric objects. As a result a user input action can also be caused by moving an object into the proximity of the OLED device, or moving the object while it is in the proximity of the OLED device. This apparatus has the advantage that the OLED device is interfaced with the electronic circuit so that the OLED means is able to generate light, and the two or more conductive elements are connected to the electronic circuit which is able to detect if a touch has occurred and send a signal to another electronic circuit. This is useful because OLED apparatus is able to generate light and also to detect when an operator has touched it. This can be used for displays and control panels.

In another embodiment the electronic circuit is comprised of a means for providing the OLED means with a voltage bias, and a current generating means for generating a current flow in each of the two or more conductive elements. Providing the OLED means with a voltage bias is advantageous, because the OLED means requires a voltage bias to generate light. Generating a current flow in the two or more conductive elements is advantageous, because objects in proximity to the conductive elements change the conductive elements capacitance. This can be sensed and used to implement a capacitive proximity sensor. It is further comprised of a means for calculating two or more capacitive coefficients by either measuring the current flow through each of the conductive elements or by measuring the voltage drop across each of the conductive elements. If a known RF current is flowing through a conductive element, then a measurement of the RF voltage can be used to calculate the capacitance. If a known RF voltage is applied to a conductive element, then a measurement of the RF current can be used to calculate the capacitance. This is advantageous, because the two or more conductive elements can be used to implement an NFI type sensor. The advantages of which have already been explained. The circuit is also comprised of a signal generating means for generating a signal, were the signal depends upon the value of the two or more capacitive coefficients. One implementation is that the electronic circuit is incorporated into or interfaced with a second electronic circuit. This signal can also be implemented by the transmission of an analog or digital signal to another electronic circuit. This has the advantage that the OLED apparatus can be incorporated into a wide variety of control circuits.

In another aspect, the invention provides for an OLED kit comprised of the OLED device and an electronic circuit for powering and operating the OLED device. The electronic circuit is operable to calculate two or more capacitive coefficients of the capacitance formed by the two or more conductive elements for detecting a user input action. This has the same advantages as the OLED apparatus, but in this case the two components are separate and they can be assembled by a user or operator.

BRIEF DESCRIPTION OF THE DRAWINGS

In the following preferred embodiments of the invention will be described, by way of example only, and with reference to the drawings in which.

DETAILED DESCRIPTION OF EMBODIMENTS

Like numbered elements in these figures are either identical elements or perform the same function. Elements which have been discussed previously will not necessarily be discussed in later figures if the function is identical.

Figure 1:
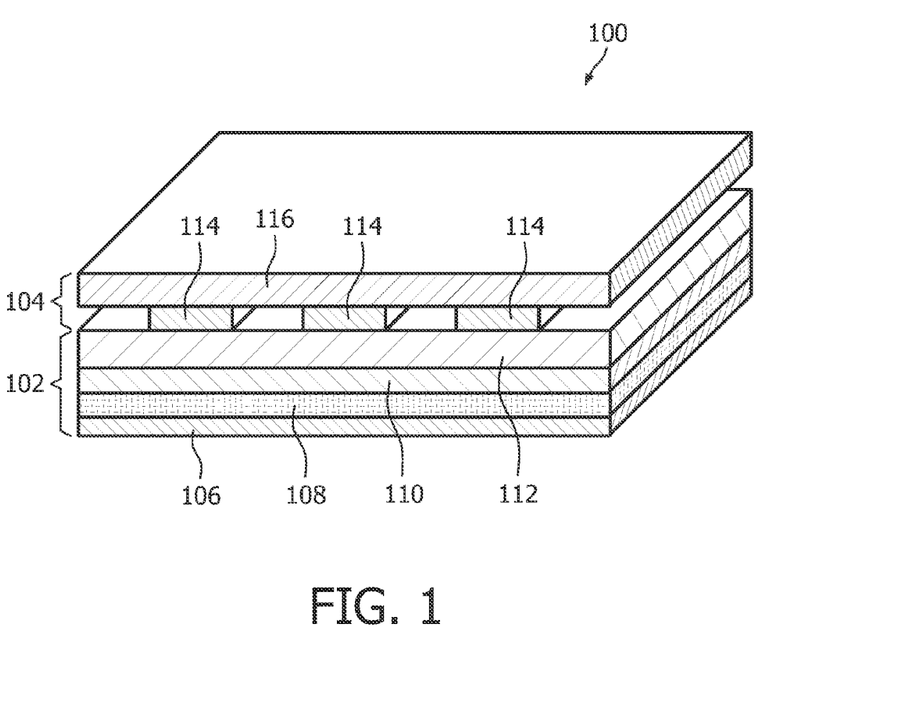
FIG. 1 shows a perspective cross sectional view of an embodiment of an OLED device with an integrated NFI touch sensor.

FIG. 1 shows an OLED device 100 comprised of an OLED means 102 with a laminated NFI sensor foil 104. There is a substrate 112 which is part of the OLED means 102. The substrate 112 has two sides. The OLED means 102 is located on the first side and the NFI sensor 104 is located on the other side. The anode 110 is located directly against the substrate 112. Located next to the anode is the organic layer 108 and on the organic layer 108 is mounted the cathode 106. When a sufficient voltage bias is applied to the anode 110 and cathode 106, light is generated in the organic layer 108. Light then travels through the anode 110 and the substrate 112. On the second side of the substrate, is the NFI sensor foil 104. Located directly immediate to the substrate 112 are conductive elements 114. In this embodiment there are long strips. Above the conductive elements is a protective dielectric layer 116. The conductive elements 114 can be made of a conductive oxide like Indium Tin Oxide (ITO). The conductive elements 114 could also be made out of an opaque electrode and then arranged in a way so that they minimize the amount of obstructed light. The conductive elements 114 function as the electrodes of an NFI touch sensor.

Figure 2:
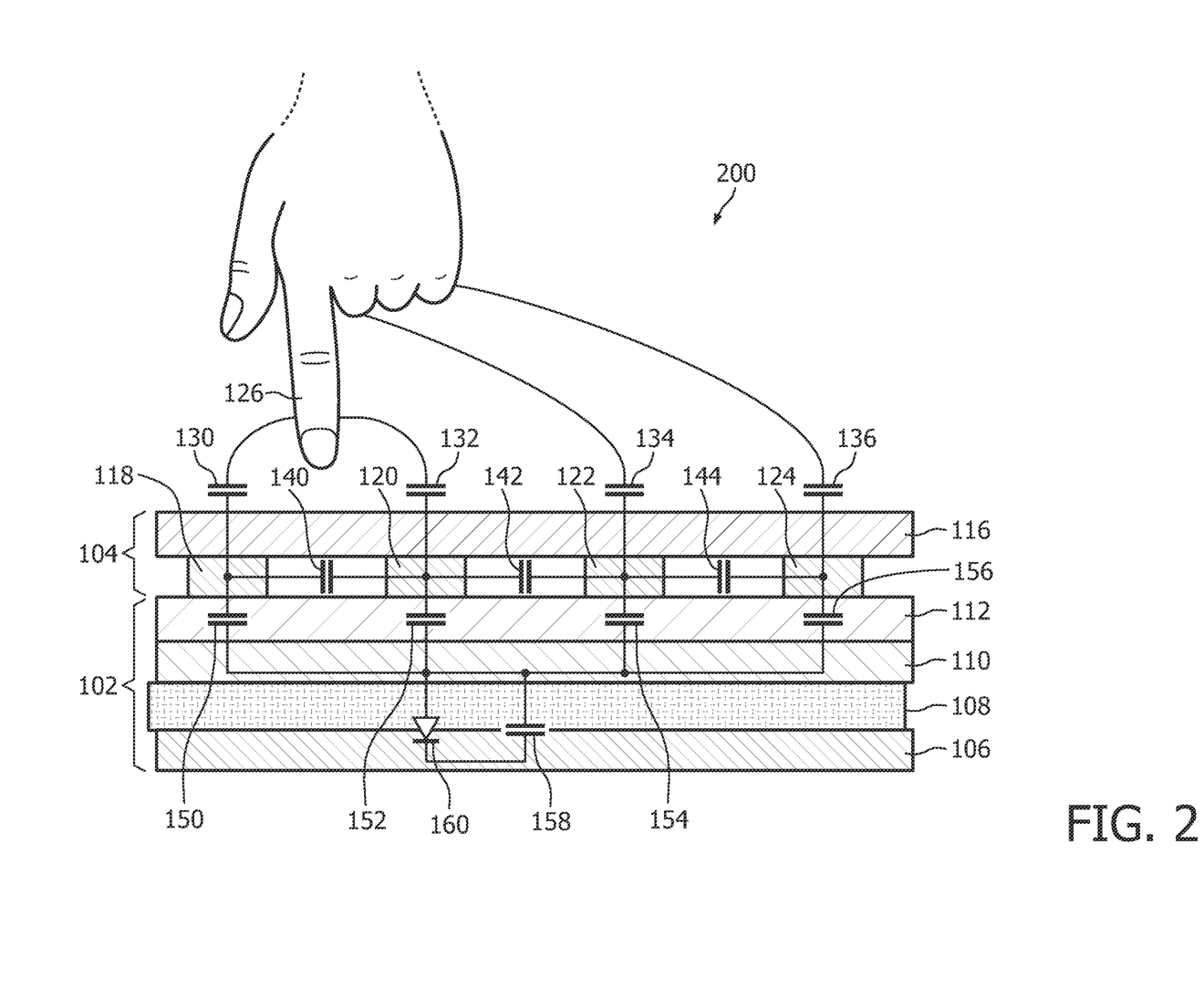
FIG. 2 shows a cross sectional view of the same embodiment shown in FIG. 1 with a simplified equivalent circuit superimposed.

FIG. 2 shows a simplified electrical model of the OLED device superimposed upon a OLED device 200. Visible is a finger 126 which is a approaching the OLED device 200. This figure shows a model of the different capacitances and their relationship with the components in the OLED device. The same OLED means 102 and NFI sensor foil 104 of FIG. 1 are shown in this figure as a cross section. There are four conductive elements in this FIGS. 118, 120, 122, and 124. There is a capacitance between each of these conductive elements 118, 120, 122, and 124 and the anode 110. The capacitance between the first conductive element 118 and the anode is 150. The capacitance between the second conductive element 120 and the anode is capacitance 152. The capacitance between the third conductive 122 element and the anode is capacitance 154. The capacitance between the fourth conductive element 124 and the anode is 156. The OLED device is modelled as a diode 160 and a capacitance 158 which represents the capacitance between the anode 110 and the cathode 106. The conductive elements also have a stray capacitance between them. Capacitance 140 is the capacitance between the first 118 and the second 120 conductive elements. Capacitance 142 is the capacitance between the second conductive element 120 and the third conductive element 122. Capacitance 144 is the capacitance between the third conductive element 122 and the fourth conductive element 124. Visible in this figure is a finger 126. There is a capacitance between the operator's finger 126 and each of the conductive elements. The capacitance between the finger 126 and the first conductive element 118 is capacitance 130. The capacitance between the finger 126 and the second conductive element 120 is capacitance 132. The capacitance between the finger 126 and the third conductive element 122 is capacitance 134. The capacitance between the finger and the fourth conductive element 124 is capacitance 136. In this figure it is seen that the finger or the operator's hand 126 is located closer to some of the conductive elements than to other conductive elements. The effect of this is that when the finger is in this position, the change in the capacitance of conductive elements 118, 120, 122, and 124 will be different. The comparison of these different changes in capacitance is how the sensor is able to detect a touch under varied conditions.

Figure 3:
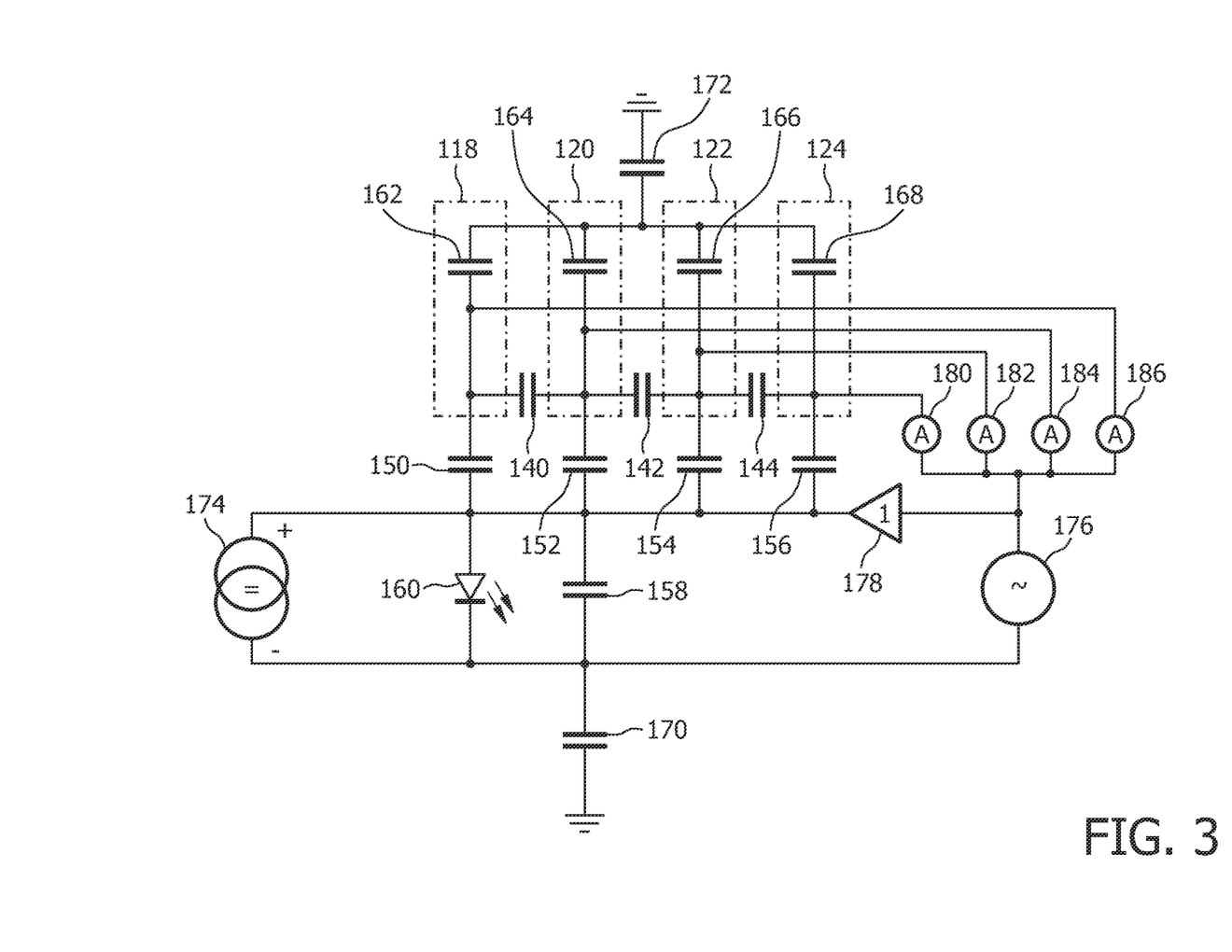
FIG. 3 shows an embodiment of a circuit used for driving a combined OLED and NFI device.

FIG. 3 shows an embodiment of an OLED apparatus. This is an electrical schematic and the OLED device is represented by several features in the schematic. The OLED means is represented by the diode 160 and the capacitance 158. These are not individual components, the diode represents the current voltage characteristic caused by the OLED means 102 and the capacitance is formed by the electrodes 106, 110 of the OLED means 102. In this embodiment there are four conductive elements 118, 120, 122 and 124. As in FIG. 2, there is a stray capacitance between each of the conductive elements. These are represented by capacitances 140, 142 and 144. These are not components which are part of an electric circuit, but they are capacitances which exist because of the physical location of the conductive elements next to each other. Also in this figure is shown a capacitance between the conductive elements 118, 120, 122 and 124 and the anode 110 of the OLED means 102. These are represented by the capacitances 150, 152, 154 and 156. Again these are not capacitors which are added as electrical components, but they are formed by the proximity of the conductive elements 118, 120, 122, and 124 to the OLED means 102. The OLED means 102 is driven by a DC power source 174. The positive output is connected to the anode 110 of the OLED means 102 and the negative output is connected to the cathode 106 of the OLED means 102. There is an RF source 176, a unity gain amplifier 178 and four current measurements or sensors 180, 182, 184 and 186. The output of the unity gain amplifier 178 is connected to the anode 110 of the OLED means 102. The input of the unity gain amplifier 178 is connected to the output of the RF generator 176. The negative of the DC power supply 174 is connected to the cathode 106 of the OLED means 102 and the ground of the RF generator 176 is connected to the negative of the DC supply 174. There is a capacitance 170 which represents the capacitance between the ground of the apparatus and earth. In an alternative embodiment the ground of the device and earth are identical.

There is a current sensor for each conducting element. The output of the RF generator is connected not only to the unity gain amplifier 178 but also to the inputs of each of the current sensors 180, 182, 184 and 186. The current sensor 186 is connected to the first conductive element 118. The second current sensor 184 is connected to the second conductive element 120. The third current sensor 182 is connected to the third conductive element 122. The fourth current sensor 180 is connected to the fourth conductive element 124. Each of the conductive elements is adapted for conducting current.

In FIG. 3 there are several different paths for conducting current. The first is through the capacitive coupling to the OLED means 102 and the second is through a capacitive coupling to ground 172. There are four capacitances corresponding to each of the conductive elements 162, 164, 166 and 168. These represent the capacitance of each of the conductive elements. Capacitance 162 corresponds to conductive element 118, capacitance 164 corresponds to the second conductive element 120, capacitance 166 corresponds to the third conductive element 122, and the fourth capacitance 168 corresponds to the fourth conductive element 124. These four capacitances represent the capacitance of each of these elements and these capacitances change as an object is brought near to the conductive elements 118, 120, 122, and 124.

As an object such as a finger 126 approaches the conductive elements it has a different proximity to each of the conductive elements and the current flowing through each element changes. A control device such as a microcontroller would compare the currents measured by the four current sensors 180, 182, 184, and 186 and use this to determine if a touch has occurred and in which location. A difficulty is that the capacitances 150, 152, 154 and 156 between the conductive elements 118, 120, 122 and 124 and the OLED means 102 can be quite large. The unity gain amplifier 178 is able to eliminate this capacitance. It puts an RF voltage bias on the anode 110 which is equivalent to the RF bias that is applied to the conductive elements. This forces the voltage across 150, 152, 154 and 156 to be zero. This effectively eliminates this capacitance. This is very advantageous because it allows a larger signal to be observed. The capacitances are measured and normally the large capacitance between the conductive elements 118, 120, 122, 124 and the anode 110 obscures the signal but this unity gain amplifier 178 eliminates this effect and makes the device more sensitive.

In an alternative embodiment the substrate 156 between the conductive elements 118, 120, 122, and 124 and the anode 110 is made thicker. This reduces the capacitances 150, 152, 154, and 156 and increases the sensitivity of the NFI sensor. In another embodiment, both the substrate thickness is increased and the unity gain amplifier 178 is used.

Figure 4:
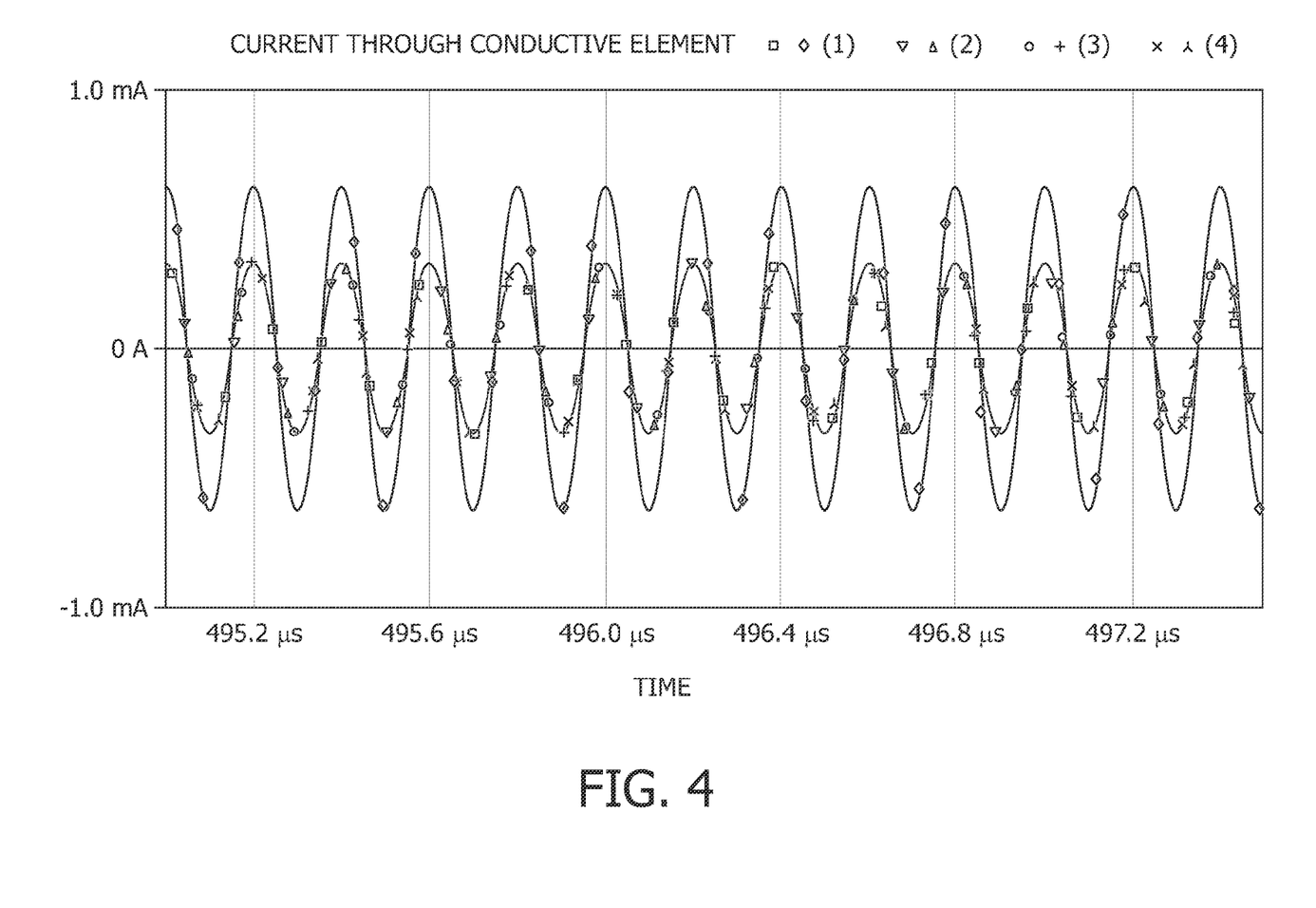
FIG. 4 shows a simulation of an embodiment of an OLED apparatus when the capacitance between the conductive elements and the OLED means is 1 pF.

FIG. 4 shows the results of a simulation of the OLED apparatus. In this simulation the capacitance between the conductive elements and the OLED means is only 1 pF. The capacitance of the touch sensors 162, 164, 166 and 168 is considered to be around 10 pF. The capacitance 162 of the first element is increased by 1 pF. In this figure we see that the current through element 1 is larger than the current through the other three conductive elements. This shows that a small change in capacitance can be detected when the capacitance between the anode and the conductive elements is small. This shows that if the dielectric thickness of the substrate is increased, then a workable device can be constructed.

Figure 5:
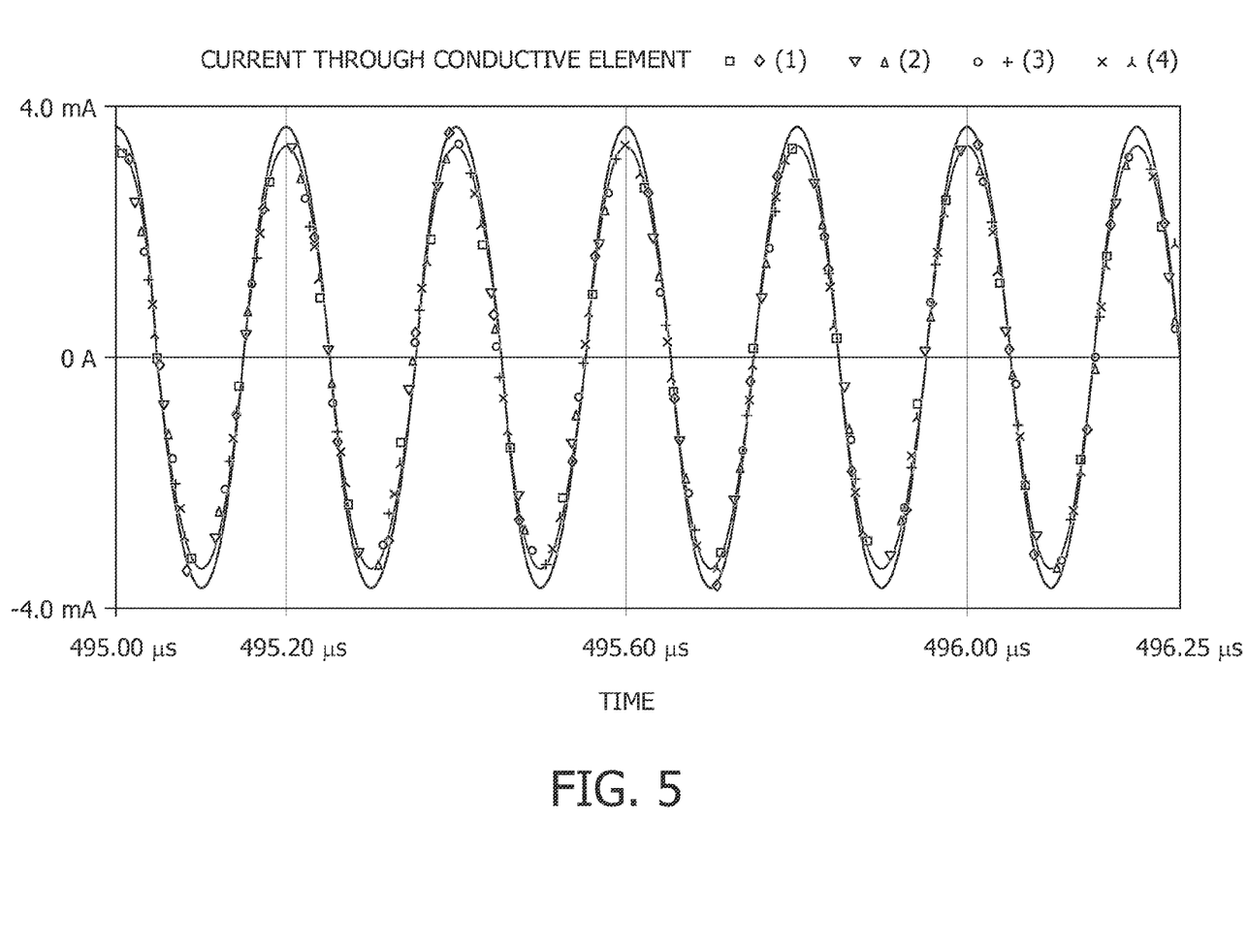
FIG. 5 shows a simulation of an embodiment of an OLED apparatus when the capacitance between the conductive elements and the OLED means is 100 pF.

FIG. 5 shows an embodiment of a simulation which shows the effect of when the capacitance between the conductive elements and the anode is 100 pF. This is a value which represents a typical self capacitance. A simple estimation can be made using the formula for a parallel plate capacitor. Assuming a typical device thickness d of 100 nm, a relative permittivity of 1 the resulting self-capacitance is about 177 $pF/mm^2$.

The self-capacitance can be used for the drive and sensing circuit of the touch sensor arrangement again the capacitance of conductive element 1, capacitance 162 is increased by 1 pF. In this figure it can be seen that there is only a minimal change between the four different currents.

Figure 6:
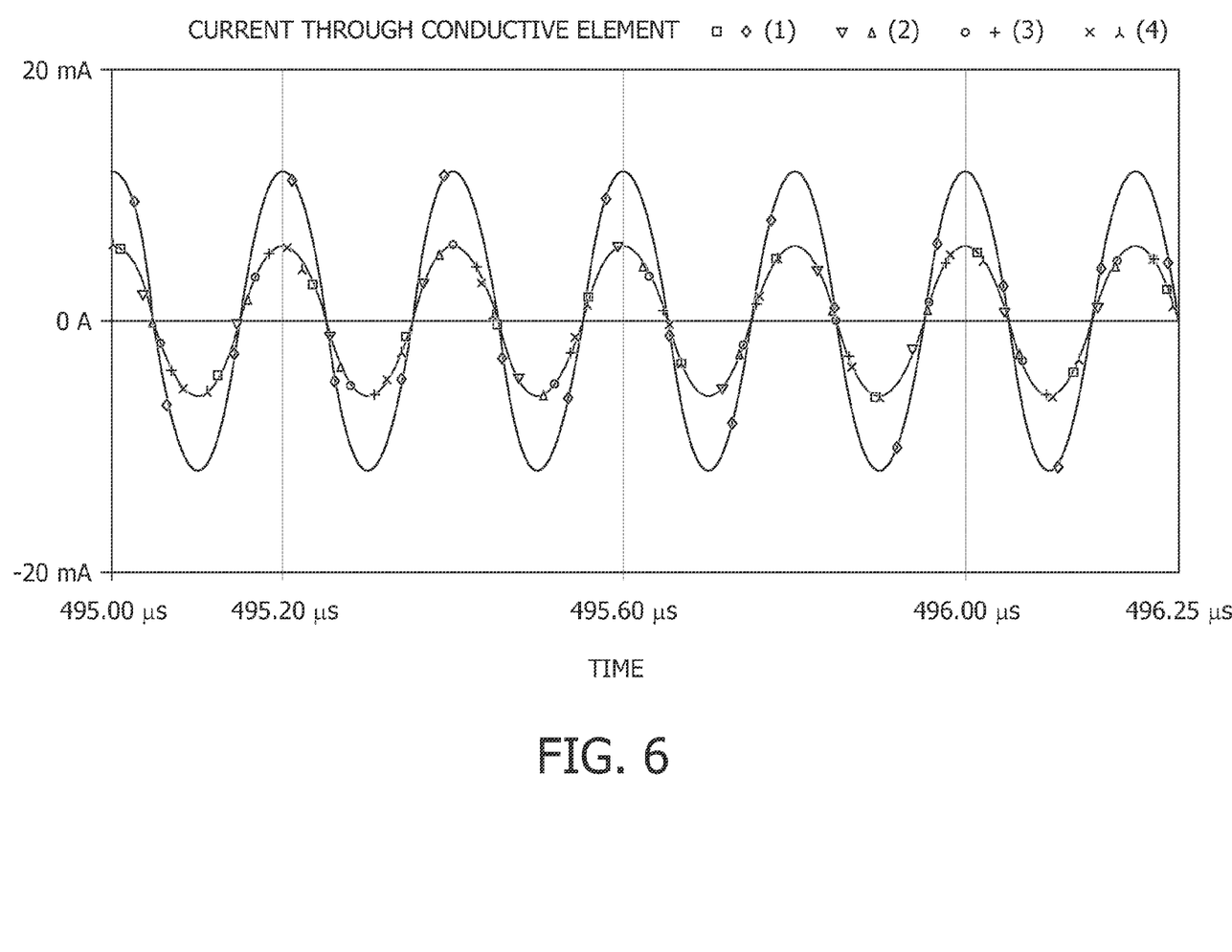
FIG. 6 shows a simulation of an embodiment of an OLED apparatus when the capacitance between the conductive elements and the OLED means is 100 pF.

FIG. 6 shows the effect of using a decoupling amplifier. The same conditions as we used in FIG. 5 are repeated here, except a unity gain amplifier is used to reduce the effect that capacitance between the conductive element and the OLED means has on the circuit. In this case the capacitance of conductive element 1 was increased from 10 pF to 11 pF. The other conductive elements have a capacitance of only 10 pF. However, it is very easy to see the difference in the current between conductive element 1 and through the other three conductive elements 2, 3 and 4. This demonstrates the utility of using the unity gain amplifier.

LIST OF REFERENCE NUMERALS

100 OLED device
102 OLED means
104 NFI sensor foil
106 Cathode
108 Organic layer
110 Anode
112 Substrate
114 Conductive element
116 Dielectric
118 Conductive element 1
120 Conductive element 2
122 Conductive element 3

124 Conductive element 4
126 Finger
130 Capacitance between conductive element 1 and finger
132 Capacitance between conductive element 2 and finger
134 Capacitance between conductive element 3 and finger
136 Capacitance between conductive element 4 and finger
140 Capacitance between conductive element 1 and conductive element 2
142 Capacitance between conductive element 2 and conductive element 3
144 Capacitance between conductive element 3 and conductive element 4
150 Capacitance between conductive element 1 and the anode
152 Capacitance between conductive element 2 and the anode
154 Capacitance between conductive element 3 and the anode
156 Capacitance between conductive element 4 and the anode
158 Capacitance of OLED means
160 Diode representing current-voltage relations ship of OLED means
162 Capacitance of conducting element 1
164 Capacitance of conducting element 2
166 Capacitance of conducting element 3
168 Capacitance of conducting element 4
170 Capacitance to ground
172 Capacitance to ground
174 DC power supply
176 RF power supply
178 Decoupling amplifier
180 Current measurement of conducting element 4
182 Current measurement of conducting element 3
184 Current measurement of conducting element 2
186 Current measurement of conducting element 1
200 OLED device

The invention claimed is:

1. An electronic circuit for interfacing with an OLED device, the OLED device comprising an OLED means including electrodes and an organic light emitting material for generating light, two or more conductive elements for conducting current, and a substrate for mounting the OLED means and the two or more conductive elements, the electronic circuit comprising:
   a voltage bias means for providing the OLED means with a voltage bias;
   a radio frequency (RF) voltage means for providing one or more of the conductive elements with an RF voltage;
   a gain amplifier configured to apply an other voltage bias to one of said electrodes, wherein said other voltage bias reduces a voltage across at least one capacitor formed between the OLED means and at least the one or more of the conductive elements;
   a current measuring means for measuring a current flow through each of the one or more of the conductive elements; and
   a signal generating means for generating a signal, wherein the signal depends upon the current flow through the one or more of the conductive elements.

2. The electronic circuit of claim 1, wherein the voltage bias means has an electrical connection means for connecting the voltage bias means to the OLED means, wherein the gain amplifier has an input and one or more outputs, wherein the RF voltage means is connected to the input of the gain amplifier, and wherein one or more of the outputs is connected to the electrical connection means.

3. The electronic circuit of claim 2, wherein the gain amplifier is a unity gain amplifier, and wherein the electrical connection means comprise an anode connection and a cathode connection, the one or more outputs being connected to the anode connection.

4. The electronic circuit of claim 1, further comprising a means for calculating two or more capacitance coefficients and wherein the signal depends upon the value of the two or more capacitance coefficients.

5. The electronic circuit of claim 1, wherein said other voltage bias reduces voltages across each capacitor formed between the OLED means and the two or more conductive elements.

6. The OLED device of claim 1, wherein a thickness of the substrate is chosen such that a capacitance between the OLED means and the two or more conductive elements is minimized.

7. An OLED device comprising:
   an OLED means for generating light including an anode, a cathode and an organic light emitting material;
   two or more conductive elements for conducting current;
   a first substrate for mounting the OLED means and the two or more conductive elements; and
   a gain amplifier configured to apply a voltage bias to the OLED means that reduces a voltage across at least one capacitor formed between the OLED means and at least one conductive element of the two or more conductive elements,
   wherein the substrate has a first surface and a second surface that opposes said first surface,
   wherein the OLED means is in contact with the first surface and the two or more conductive elements are mounted to the second surface above the anode, the cathode and the organic light emitting material of the OLED means.

8. The OLED device of claim 7, further comprising a second substrate adapted for lamination to the OLED means, wherein the second substrate is transparent, wherein the second substrate has a first and a second surface, wherein the first surface of the second substrate is laminated to the second surface of the first substrate, wherein the two or more conductive elements are in contact with the second surface of the second substrate.

9. The OLED device of claim 8, further comprising a near field imaging (NFI) touch sensor foil, wherein the NFI touch sensor foil comprises the second substrate and the two or more conductive elements.

10. The OLED device of claim 8, wherein the second substrate is flexible.

11. The OLED device of claim 8, wherein the thickness of the second substrate is chosen such that a capacitance between the OLED means and the two or more conductive elements is minimized.

12. The OLED device of claim 8, wherein the two or more conductive elements are adapted for transmitting light.

13. The OLED device of claim 8, wherein the conductive elements are arranged to maximize the amount of light which is visible from the OLED device.

14. An OLED apparatus comprised of the OLED device of claim 8 and an electronic circuit for powering and operating the OLED device, the electronic circuit being operable to calculate two or more capacitive coefficients of a capacitance formed by the two or more conductive elements for detecting a user input action.

15. The OLED apparatus of claim 14, wherein the electronic circuit comprises: a voltage bias means for providing the OLED means with an other voltage bias, a current generating means for generating a current flow in each of the two or more conductive elements, a calculation means for calculating the two or more capacitive coefficients using one of the following: the current flow through each of the two or more conductive elements or a voltage drop across each of the two or more conductive elements, a signal generating means for generating a signal, and wherein the signal depends upon the value of the two or more capacitive coefficients.

16. An OLED kit comprising the OLED device of claim 8 and an electronic circuit for powering and operating the OLED device, the electronic circuit being operable to calculate two or more capacitive coefficients of a capacitance formed by the two or more conductive elements for detecting a user input action.

17. The OLED device of claim 7, wherein the thickness of the first substrate is chosen such that a capacitance between the OLED means and the two or more conductive elements is minimized.

18. The OLED device of claim 7, wherein the voltage bias reduces voltages across each capacitor formed between the OLED means and the two or more conductive elements.

19. An OLED device comprising:
   an OLED means for generating light;
   two or more conductive elements for conducting current; and
   a first substrate for mounting the OLED means and the two or more conductive elements,
   wherein the substrate has a first surface and a second surface,
   wherein the OLED means is in contact with the first surface and the two or more conductive elements are mounted to the second surface, and
   wherein a thickness of the substrate is chosen such that a capacitance between the OLED means and the two or more conductive elements is minimized.

20. An electronic circuit for interfacing with an OLED device, the OLED device comprising an OLED means for generating light, two or more conductive elements for conducting current, and a substrate for mounting the OLED means and the two or more conductive elements, the electronic circuit comprising:
   a voltage bias means for providing the OLED means with a voltage bias;
   a radio frequency (RF) voltage means for providing one or more of the conductive elements with an RF voltage;
   a current measuring means for measuring a current flow through each of the one or more of the conductive elements; and
   a signal generating means for generating a signal, wherein the signal depends upon the current flow through the one or more of the conductive elements,
   wherein a thickness of the substrate is chosen such that a capacitance between the OLED means and the two or more conductive elements is minimized.

\* \* \* \* \*